(12) United States Patent  
Abbas Mohamed Helmy et al.

(10) Patent No.: US 12,003,267 B2
(45) Date of Patent: Jun. 4, 2024

(54) HIGH LINEARITY MODES IN WIRELESS RECEIVERS

(71) Applicant: QUALCOMM Incorporated, San Diego, CA (US)

(72) Inventors: Ahmed Abbas Mohamed Helmy, San Diego, CA (US); Francesco Gatta, San Diego, CA (US); Balasubramanian Ramachandran, Hyderabad (IN); Abhishek Ananthrao Kulkarni, Gulbarga (IN); Prakash Thoppay Egambaram, San Diego, CA (US); Hasnain Lakdawala, San Diego, CA (US); Aleksandar Miodrag Tasic, San Diego, CA (US); Jang Joon Lee, San Diego, CA (US); Kyle David Holland, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 315 days.

(21) Appl. No.: 17/448,750

(22) Filed: Sep. 24, 2021

(65) Prior Publication Data

US 2023/0097399 A1    Mar. 30, 2023

(51) Int. Cl.
*H04B 1/40* (2015.01)
*H04B 1/10* (2006.01)
*H03F 3/24* (2006.01)

(52) U.S. Cl.
CPC .............. *H04B 1/40* (2013.01); *H04B 1/109* (2013.01); *H03F 3/24* (2013.01); *H03F 2200/09* (2013.01);

(Continued)

(58) Field of Classification Search
CPC . H03G 3/20; H04B 1/44; H04B 1/401; H04B 1/40; H04B 1/109; H04B 1/525;
(Continued)

(56) References Cited

U.S. PATENT DOCUMENTS

| 10,033,340 B1 | 7/2018 | Hanafi et al. |
| 2013/0102267 A1 | 4/2013 | Haub et al. |

(Continued)

FOREIGN PATENT DOCUMENTS

| KR | 20190110006 A | * | 9/2019 |
| KR | 20190110006 A | | 9/2019 |

OTHER PUBLICATIONS

International Search Report and Written Opinion—PCT/US2022/043228—ISA/EPO—dated Jan. 4, 2023.

*Primary Examiner* — Vinncelas Louis
(74) *Attorney, Agent, or Firm* — Patterson + Sheridan, L.L.P.

(57) ABSTRACT

Certain aspects of the present disclosure generally relate to techniques and apparatus for operating a wireless receiver of the apparatus in a high linearity mode. An example method includes operating the apparatus in a first mode with transmission of a plurality of transmit signals. The method also includes attenuating a received signal via an attenuator while operating the apparatus in the first mode. The method further includes amplifying the attenuated signal with an amplifier while operating the apparatus in the first mode. For certain aspects, the method further involves operating the apparatus in a second mode, bypassing the attenuator while operating the apparatus in the second mode, and amplifying the received signal with the amplifier while operating the apparatus in the second mode.

24 Claims, 7 Drawing Sheets

(52) U.S. Cl.
CPC .. *H03F 2200/165* (2013.01); *H03F 2200/211* (2013.01); *H03F 2200/451* (2013.01)

(58) Field of Classification Search
CPC ........ H04B 1/005; H04B 1/10; H04B 1/0483; H04W 76/15; H03F 3/24; H03F 2200/09; H03F 2200/165; H03F 2200/211; H03F 2200/451
See application file for complete search history.

(56) References Cited

U.S. PATENT DOCUMENTS

| | | | |
|---|---|---|---|
| 2013/0315348 A1* | 11/2013 | Tasic | H03G 3/20 |
| | | | 375/340 |
| 2017/0257135 A1* | 9/2017 | Solomko | H04B 1/401 |
| 2018/0192320 A1* | 7/2018 | Khlat | H04B 1/44 |
| 2020/0059868 A1* | 2/2020 | Yang | H04W 76/15 |

* cited by examiner

HIGH LINEARITY MODES IN WIRELESS RECEIVERS

BACKGROUND

Field of the Disclosure

Certain aspects of the present disclosure generally relate to wireless communications and, more particularly, to techniques and apparatus operating a wireless receiver in a high linearity mode.

Description of Related Art

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system).

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include radio frequency (RF) front-end circuitry, which may be used for communication within a millimeter wave (mmW) communication band, for example. The RF front-end circuitry may operate with a communication mode that allows for transmitting multiple signals concurrently. In some cases, the transmission of multiple signals can introduce jamming in a receive path of a wireless receiver.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure provide a method of wireless communication by an apparatus. The method generally includes operating the apparatus in a first mode. Operating in the first mode includes transmitting a plurality of transmit signals. The method also includes attenuating a received signal via an attenuator while operating the apparatus in the first mode. The method further includes amplifying the attenuated signal with an amplifier while operating the apparatus in the first mode.

Certain aspects of the present disclosure provide a wireless device. The wireless device generally includes: one or more transmitters; a receiver; at least one processor coupled to the receiver; and a memory coupled to the at least one processor. The one or more transmitters are configured to transmit a plurality of transmit signals. The receiver includes (i) an attenuator and (ii) an amplifier having an input coupled to an output of the attenuator. The memory stores computer-executable instructions, which, when executed by the at least one processor perform an operation. The operation includes operating the one or more transmitters and the receiver in a first mode. The operating includes transmitting the plurality of transmit signals using the one or more transmitters. The operation also includes attenuating a received signal via the attenuator while operating in the first mode. The operation further includes amplifying the attenuated signal with an amplifier while operating in the first mode.

Certain aspects of the present disclosure provide an apparatus. The apparatus includes means for concurrently transmitting a plurality of transmit signals. The apparatus also includes means for controlling operation of the apparatus in a first mode. Operation in the first mode includes concurrently transmitting the plurality of transmit signals using the means for transmitting. The apparatus also includes means for attenuating a received signal during operation of the apparatus in the first mode. The apparatus further includes means for amplifying the attenuated signal during operation of the apparatus in the first mode.

Certain aspects of the present disclosure provide a method of wireless communication by an apparatus. The method generally includes concurrently transmitting a plurality of transmit signals and selectively attenuating a received signal via an attenuator while concurrently transmitting the plurality of transmit signals. For certain aspects, the method further includes amplifying the selectively attenuated signal with an amplifier while concurrently transmitting the plurality of transmit signals. For certain aspects, the selectively attenuating includes controlling a bypass switch coupled in parallel with the attenuator.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
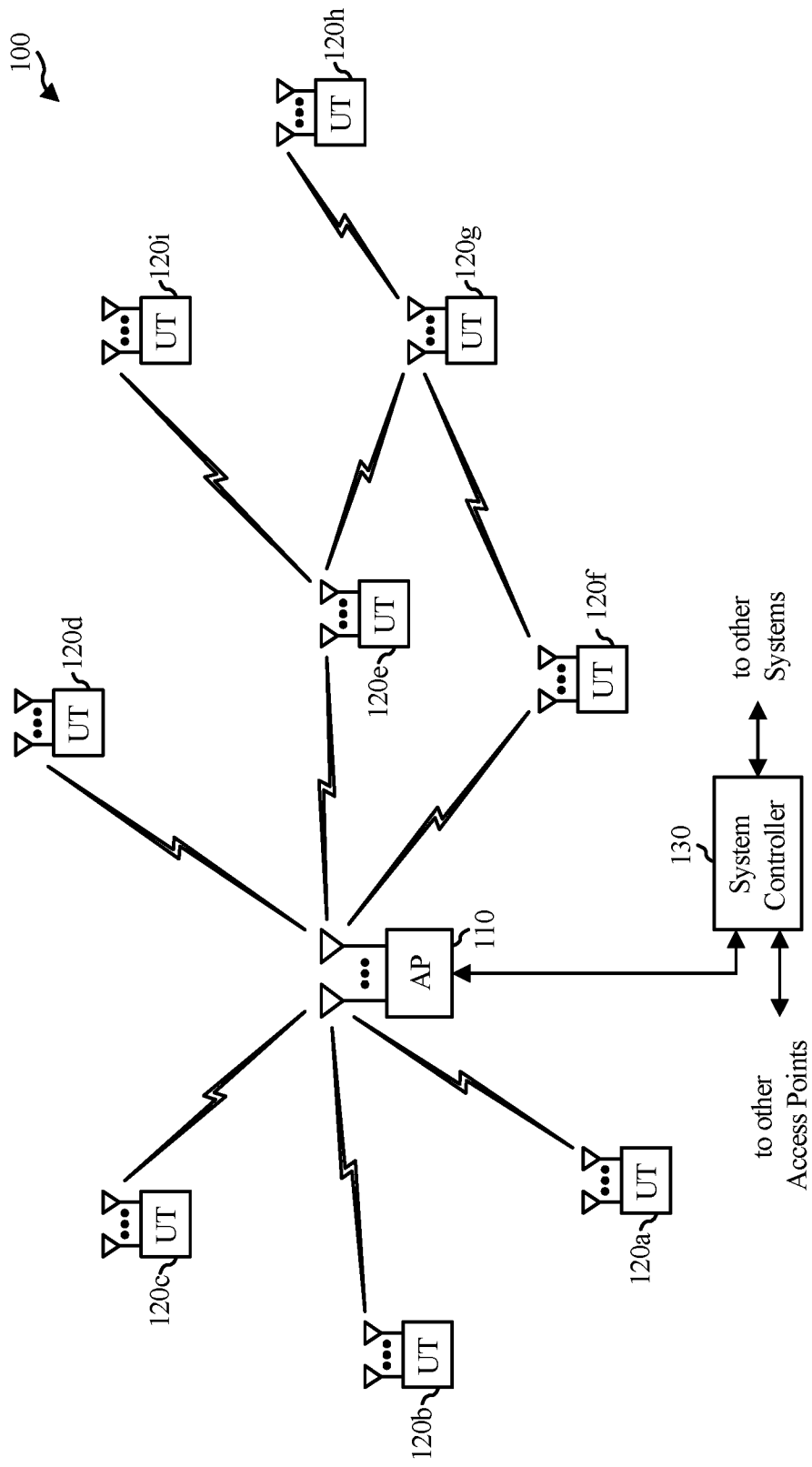
FIG. 1 is a diagram of an example wireless communications network, in accordance with certain aspects of the present disclosure.

Certain aspects of the present disclosure generally relate to techniques and apparatus for operating a wireless transceiver with a high linearity mode in a receive path when performing wireless communications. The techniques described herein can improve the sensitivity of wireless receivers for various operating modes, such as when concurrently transmitting a plurality of transmit signals, as in the case of carrier aggregation (CA) modes, dual connectivity (DC) modes, etc.

For example, some communication devices may support a CA mode, a DC mode, or a CA mode and a DC mode. These various operating modes can be used in time division duplexing (TDD) modes and/or frequency division duplexing (FDD) systems. When operating in a CA mode, two or more component carriers (also referred to as carriers) may be combined (or aggregated) in order to increase the bandwidth, and thereby increase the data rate. One reference example of a CA mode is uplink CA (ULCA), which is a technique that enables the communication device (e.g., user equipment (UE)) to transmit on multiple uplink component carriers simultaneously (e.g., concurrently transmit multiple transmit signals).

When operating in DC mode, the communication device (e.g., UE) may be connected to, and receive service from, two different radio access networks (RANs). As a reference example, dual connectivity between (i) Evolved-Universal Mobile Telecommunications System Terrestrial Radio Access Network (E-UTRAN) (also known as LTE or 4G (the fourth generation of mobile phone standards and technology)) and (ii) NR (also known as 5G NR (the fifth generation of mobile phone standards and technology)) is commonly referred to as EN-DC. In an EN-DC scenario, the communication device (e.g., UE) may be connected to, and receive service from, a RAN node (also referred to herein generally as a BS) associated with LTE (e.g., LTE BS, such as an eNB) and a RAN node associated with 5G NR (e.g., NR BS, such as a gNB).

Operating in CA modes and/or DC modes can impose high linearity demands on a wireless transceiver (e.g., the transceiver front end) of a communication device. As such, one challenge with operating in CA modes and/or DC modes is that the wireless transceiver can be subject to jamming signal(s) that causes desensing of receive operations of the transceiver. In some cases, desensing of receive operations by the transceiver can be caused by transmit operations of the transceiver in the same or different band(s) as the receive operations. The desensing of the receive operations can impact the ability of the transceiver to meet certain sensitivity specifications (e.g., reference sensitivity power level (REF SENS)) as specified by wireless communication technical standards (e.g., 3GPP technical specifications), when operating in CA modes and/or DC modes.

To address this, certain aspects described herein can employ a high linearity mode that enables the wireless receiver to maintain high linearity, and in turn, meet sensitivity specifications, when performing receive operations as part of a CA mode and/or DC mode. The aspects described herein can provide high linearity receivers in the presence of jammer signals (also referred to as jamming signals, jammer components, or jammers) in CA and DC. In one aspect described below, the wireless receiver may operate in a high linearity mode when the wireless receiver (or transceiver) is configured in a CA mode (e.g., ULCA) or a DC mode (e.g., EN-DC).

When operating in the high linearity mode, the wireless receiver (or transceiver) can control a bypass switch to couple a front-end attenuator to a receive (RX) chain of the wireless receiver (or transceiver). The front-end attenuator can attenuate one or more received signals (including jammer signals and a desired signal) before the received signals are input into an amplifier (e.g., a low noise amplifier) in the RX chain. In this manner, aspects can significantly reduce the impact of jammers while maintaining high sensitivity (e.g., as specified by wireless communication technical standards).

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Wireless Communications

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In some aspects, the user terminal 120 may include a transceiver front end with a receive (RX) path configured to operate in a high linearity mode when configured in a carrier aggregation (CA) mode or dual connectivity (DC) mode.

Figure 2:
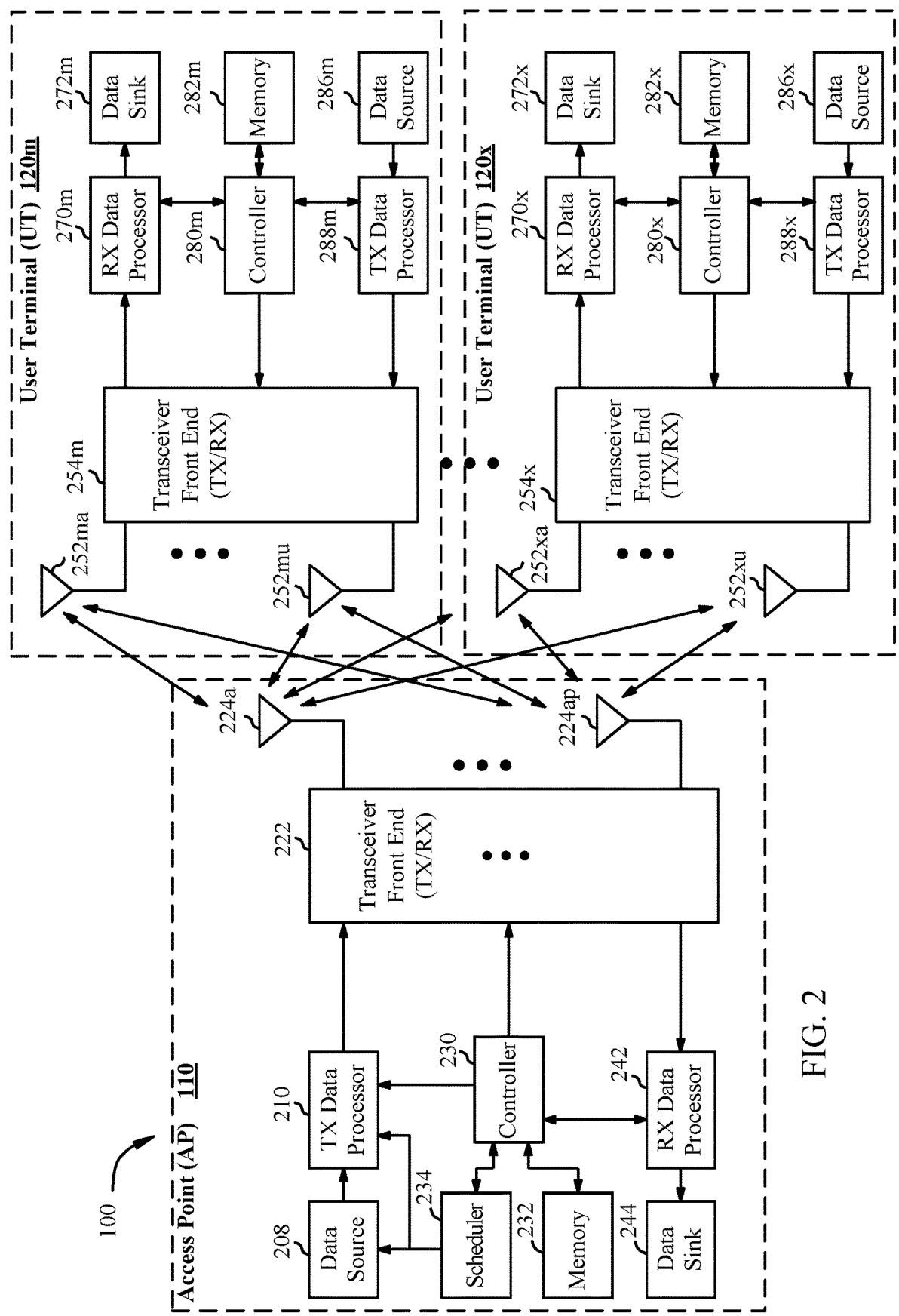
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via one or more frequency channels, and a "receiving entity" is an independently operated apparatus or device capable of receiving data via one or more frequency channels. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. A RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. A RX data processor 270 processes (e.g., demodulates, deinterleaves, and decodes) the recovered downlink data symbol stream to obtain decoded data for the user terminal. In some aspects, the transceiver front end 254 (and more specifically, the RX path) may be configured to operate in a high linearity mode when performing wireless communications using a CA mode or a DC mode, as described in more detail herein.

Figure 3:
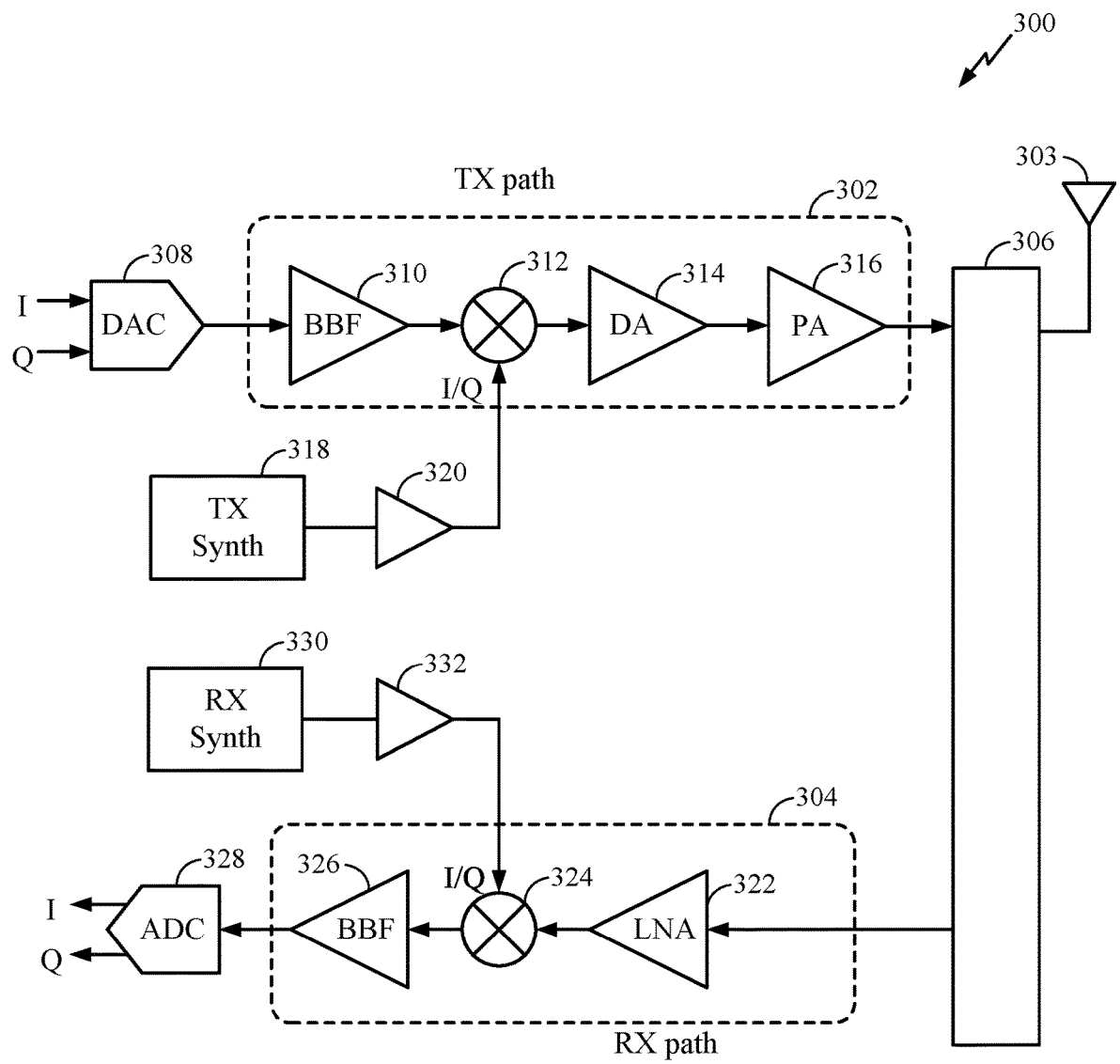
FIG. 3 is a block diagram of an example transceiver front end, in accordance with certain aspects of the present disclosure.

FIG. 3 is a block diagram of an example transceiver front end 300, such as transceiver front end 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like. Note that although a single RX path and a single TX path are depicted in FIG. 3, the transceiver front end 300 can include multiple RX paths and/or multiple TX paths which can be connected to one or more antennas 303.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. The LNA 322 may have an adjustable gain. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert the RF signal to a baseband signal). The baseband signals output by the mixer 324 may be filtered by the BBF 326 before being converted by an analog-to-digital converter (ADC) 328 to digital I or Q signals for digital signal processing.

Although the block diagram of FIG. 3 depicts the transceiver front end 300 as a homodyne configuration utilizing a single frequency conversion, aspects of the present disclosure are not limited to this configuration. For example, one or more of the TX path 302 or the RX path 304 can be configured as a superheterodyne configuration utilizing more than one frequency conversion. For example, in the RX path 304, a first mixer (not shown, but replacing mixer 324) may be utilized to downconvert a received RF signal to an intermediate-frequency (IF) signal using a first LO signal, and a second mixer (not shown) may be utilized to downconvert the IF signal to a baseband (BB) signal using a second LO signal.

While it is desirable for the output of an LO to remain stable in frequency, tuning the LO to different frequencies may entail using a variable-frequency oscillator. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by a RX frequency synthesizer 330, which may be buffered or amplified by amplifier 332 before being mixed with the RF signals in the mixer 324.

Example High Linearity Modes in Wireless Receivers for Sensitivity Improvement During Carrier Aggregation and DC Modes Communication devices may employ techniques, such as carrier aggregation and dual connectivity, to increase bandwidth and data rate when performing wireless communications. In some cases, when using these techniques, the communication devices can be susceptible to jammer signals that cause desensing of receive operations of the communication device. For example, desensing of receive operations can be caused by one or more transmit or out-of-band (OOB) jammer signals from self-transmit or other signals. The desensing of the receive operations, in turn, can impact the ability of the communication device to meet sensitivity specifications (e.g., REF SENS), when operating in carrier aggregation and/or dual connectivity modes.

Assume, for example, that a communication device (e.g., UE) is operating in CA with two aggregated bands, B2 and B66. In this example, the communication device may simultaneously receive on a first carrier (e.g., 1935 MHz) in B2 (referred to herein as B2 Rx) and on a second carrier (e.g., 2195 MHz) in B66 (referred to herein as B66 Rx), and/or simultaneously transmit on a third carrier (e.g., 1855 MHz) in B2 (referred to herein as B2 Tx) and on a fourth carrier (e.g., 1775 MHz) in B66 (referred to herein as B66 Tx). In some cases, when using this CA configuration, the transmit operations on B2 Tx and B66 Tx may cause desensing of the receive operations on B2 Rx. For example, the intermodulation distortion (IMD) component of B66 Tx and B2 Tx due to the third-order intercept point (IP3) of the receiver may result in an intermodulation component falling in the B2 receive range, causing desense (e.g., 2*B2 Tx−B66 Tx=B2 Rx).

Figure 4:
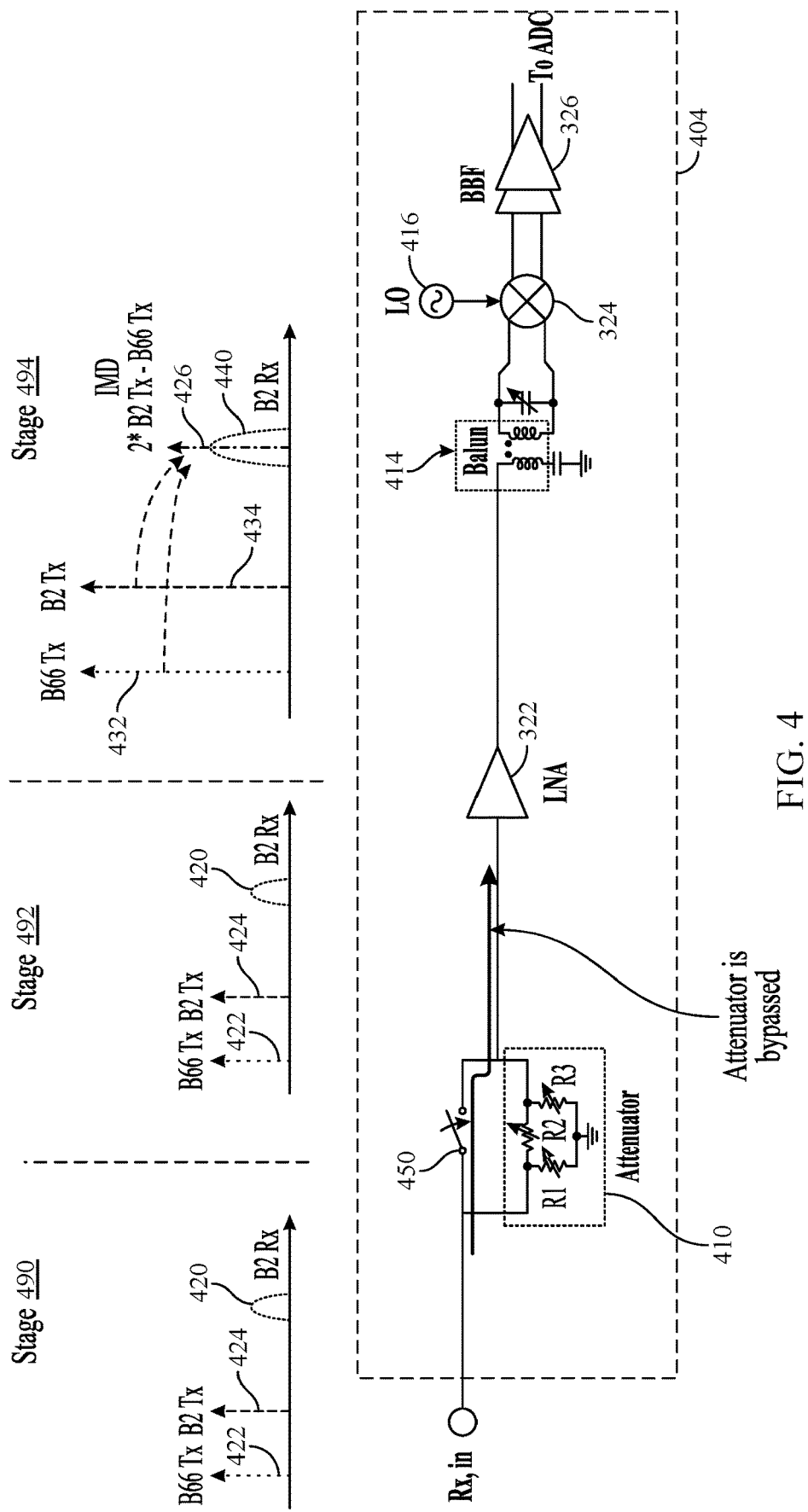
FIG. 4 illustrates an example desensing scenario for a transceiver operating with a low linearity mode in a receive path, in accordance with certain aspects of the present disclosure.

Consider the scenario in FIG. 4, which depicts an example of desensing of RX operations of a transceiver front end, such as transceiver front end 300. In this example, the transceiver front end includes a RX path 404, which may also be referred to as a victim path. The RX path 404 may be similar to the RX path 304. For example, the RX path 404 includes an attenuator 410, a bypass switch 450, a LNA 322, a balun 414, a mixer 324, a LO 416, and a BBF 326. The attenuator 410 includes tunable resistors R1, R2, and R3. Although all three resistors R1, R2, and R3 are illustrated as being tunable, one or more of these resistors may have a fixed resistance. The LO 416 may be implemented, for example, by a RX frequency synthesizer 330 to produce a receive LO frequency, as described above with respect to FIG. 3. Note that the RX path 404 is a reference example of a RX path that may be included within a transceiver front end 300, and that the transceiver front end 300 can include RX path(s) with different components. For example, in some aspects, the RX path 404 may not include a balun 414. Hence, the optional balun 414 is illustrated within a dashed box.

To meet the high linearity demands associated with operating modes, such as CA and DC, conventional techniques typically do not include an attenuator or bypass the attenuator 410 in the RX path 404 when simultaneously transmitting on one or more carriers (e.g., in B2 Tx and B66 TX) in CA or DC. When the attenuator 410 is bypassed, the receiver OOB non-linearity may be dominated by the non-linearity of the LNA 322, which is at the beginning of the RX path 404. Here, the LNA-limited Nth-order intercept point (IPN) linearity may cause the intermodulation of the transmit signals to fall in the RX band at the output of the LNA 322.

Assume, for example, the RX path 404 is configured to receive a signal in the B2 Rx band 420 (e.g., the RX path 404 is configured as a B2 Rx path). When the transceiver is configured in CA or DC, the transceiver may also transmit signals 422 and 424 in B66 Tx and B2 Tx, respectively. The transmit signals 422, 424 are shown relative to the B2 Rx band 420 in stage 490 (e.g., pre-attenuator stage) and after the attenuator 410 is bypassed in stage 492.

However, in stage 494, the non-linearity of the LNA 322 may introduce, at the output of the LNA 322, a jammer signal 426 having a frequency that falls in the receive range of B2 Rx band 440. In particular, the jammer signal 426 may be a third-order intermodulation product from the amplified transmit signals 432 and 434. The jammer signal 426 may then be downconverted along with the signal in the B2 Rx band 440, causing desense of the receiver. Assuming the Tx signals are each approximately −11 dBm and the IP3 (e.g., IPN, N=3) of the transceiver is approximately 7 dBm, the third-order intermodulation product may be approximately −47 dBm, causing a desense specification to fail (e.g., by approximately 20 dB according to certain wireless communication technical standards). Note, the transmit signals 432, 434 in stage 494 may be amplified versions of the transmit signals 422, 424, respectively, in stage 492.

According to certain aspects herein, the receiver (e.g., RX path 404) can operate in a high linearity mode (e.g., by routing through the attenuator 410) when the transceiver front end is configured in CA (e.g., ULCA) or DC (e.g., EN-DC) mode. The receiver can operate in a low linearity mode when the transceiver front end is not configured in CA or DC mode.

Figure 5:
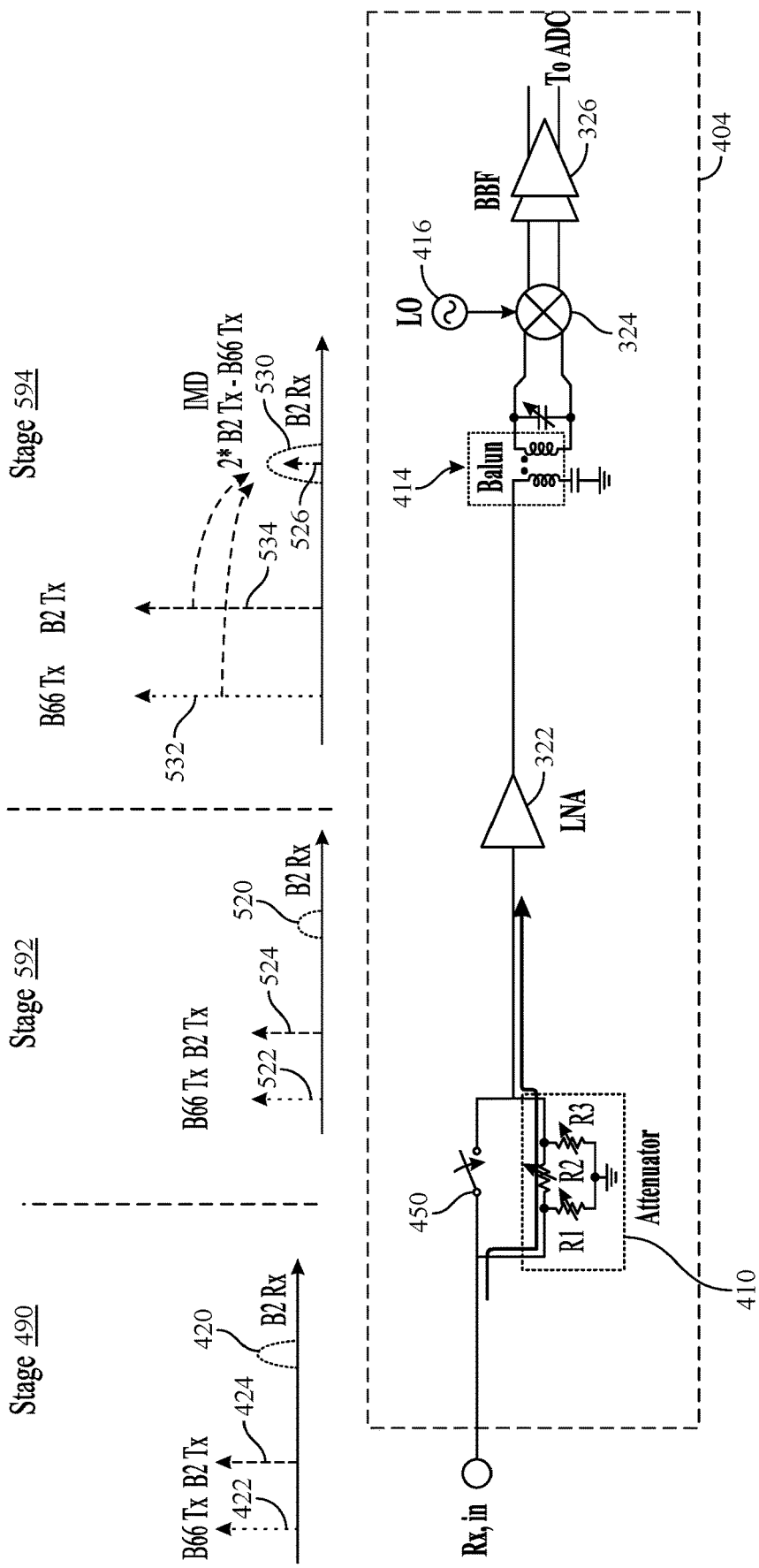
FIG. 5 illustrates an example transceiver front end operating with a high linearity mode in the receive path, in accordance with certain aspects of the present disclosure.

FIG. 5 illustrates an example of the transceiver front end operating with a high linearity mode in the RX path 404, according to certain aspects of the present disclosure. In FIG. 5, the RX path 404 may be configured to receive a signal in the B2 Rx band 420 and may be subject to transmit signals 422 and 424. The transmit signals 422 and 424 may be transmitted in B66 Tx and B2 Tx, respectively, as described above.

In the high linearity mode, the transceiver front end can control (e.g., open) the bypass switch 450, so that the transmit signals 422, 424, and the signal in the B2 Rx band 420 are routed through the attenuator 410. The attenuator 410 can attenuate the signal in the B2 Rx band 420 and the transmit signals 422, 424 prior to the input of the LNA 322. In the low linearity mode, in contrast, the transceiver front end can control (e.g., close) the bypass switch 450, so that the attenuator 410 is bypassed prior to the input of the LNA 322. Note that the attenuator 410 is shown as a pi-pad attenuator circuit, which is a reference example of an attenuator circuit that can be used to implement the techniques described herein. More generally, aspects described herein can use any suitable type of attenuator circuit design (for the attenuator 410) to implement the techniques described herein.

As shown in FIG. 5, after passing through the attenuator 410 in stage 592, the signal in the B2 Rx band 420 and transmit signals 422, 424 are attenuated to generate an attenuated signal in the B2 Rx band 520 and attenuated transmit signals 522, 524. The nonlinearity of the LNA 322 may introduce, at the output of the LNA, a jammer signal 526 (e.g., an IMD component) having a frequency that falls in the receive range of B2 Rx. Similar to the jammer signal 426 of FIG. 4, the jammer signal 526 may be a third-order intermodulation product from the amplified transmit signals 532 and 534. However, as shown in stage 594, due to the attenuation of the transmit signals via the attenuator 410, the signal level of the jammer signal 526 is significantly lower than the signal level of the jammer signal 426, and may be lower than the signal level of the amplified signal in the B2 Rx band 530. Note, the transmit signals 532, 534 in stage 594 may be amplified versions of the transmit signals 522, 524, respectively, in stage 592. Similarly, the transmit signals 522, 524 in stage 592 may be attenuated versions of the transmit signals 422, 424, respectively, in stage 490.

In this manner, aspects can reduce the IMD component resulting from the transmit signals at the output of the LNA 322, when the transceiver front end is configured in CA mode or DC mode. For example, assuming the attenuator 410 attenuates the signals by x dB, where $0 < x \leq 15$, the RX path gain may drop by x dB, the input Nth-order intercept point (IIPN) may improve by x dB, and the IMD may improve by x*N. In some cases, the drop in the gain may be recovered in the BBF 326. For example, the BBF 326 may have a first gain while the transceiver front end is operating with a high linearity mode in the RX path, and the BBF 326 may have a second gain while the transceiver front end is operating with a low linearity mode in the RX path, where the first gain is greater than the second gain. In some cases, attenuating the signals by x dB may degrade the noise figure (NF) by x dB. In these instances, the noise figure degradation may have a less significant impact on the receiver operation than the IMD desensing.

According to certain aspects, instead of using the attenuator 410 to suppress the transmit signals 422, 424, the receive path can be implemented by a mixer-first architecture to improve the IMD, but perhaps at the cost of noise figure degradation. In this mixer-first architecture, the transmit signals may bypass the attenuator 410 and the LNA 322, which is the source of the non-linearity that causes the desensing of the RX operations.

According to certain aspects, while operating in CA or DC mode, the transceiver front end (and more particularly, the receiver) can configure the attenuation of the attenuator according to the power of the jammer signals. In these aspects, the receiver can (i) refrain from using the high linearity mode when configured for CA or DC mode or (ii) reduce the attenuation as a function of the Tx power when configured for CA or DC mode.

In some scenarios, the transmit signals may cause an IMD component to be generated in a different RX path than the victim path. This different RX path may be referred to herein as the aggressor path. In these scenarios, due to limited isolation between the aggressor and victim paths (e.g., in cases where these paths are adjacent), the IMD component generated in the aggressor path may leak or otherwise be coupled to the victim path and cause desensing of RX operations in the victim path. To address this, aspects may configure the transceiver front end to implement the high linearity mode in the aggressor path, as opposed to the victim path.

Figure 6:
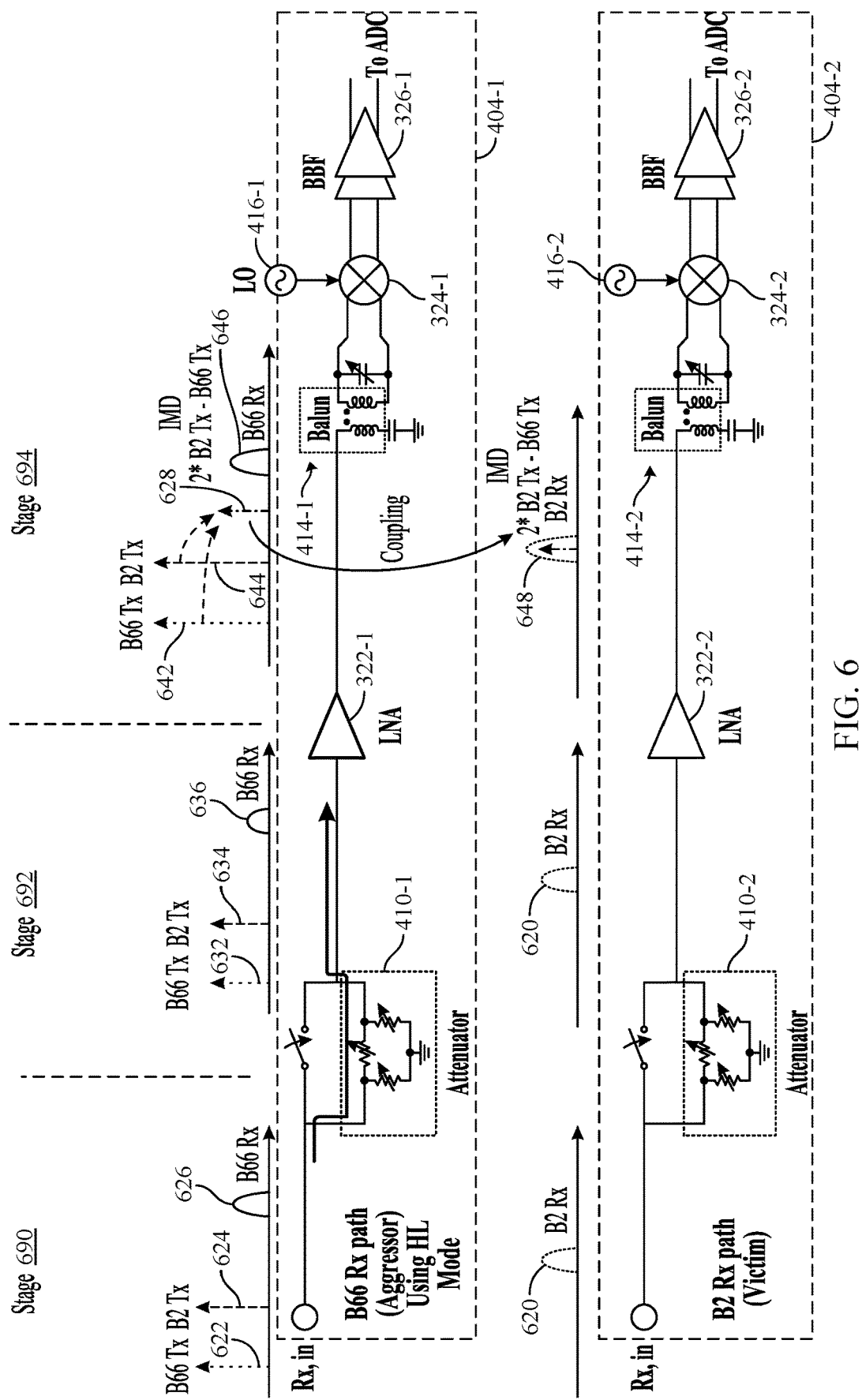
FIG. 6 illustrates another example of a transceiver front end operating with a high linearity mode in an aggressor receive path, in accordance with certain aspects of the present disclosure.

FIG. 6 illustrates another example of the transceiver front end operating with a high linearity mode in a receive path, according to certain aspects of the present disclosure. In FIG. 6, the RX path 404-1 (e.g., aggressor path) may be configured to receive a signal in the B66 Rx band 626 while transmit signals 622 and 624 are concurrently being transmitted. The transmit signals 622 and 624 may be transmitted in B66 Tx and B2 Tx, respectively. Also in FIG. 6, the RX path 404-2 (e.g., victim path) may be configured to receive a signal in the B2 Rx band 620.

The RX path 404-1 and the RX path 404-2 may be located adjacent to one another. In this scenario, due in part to the coupling between the RX path 404-1 and the RX path 404-2, a jammer signal 628 (e.g., an IMD component resulting from the third-order intermodulation product of amplified transmit signals 642 and 644) may leak to RX path 404-2 and fall within the B2 Rx band 648, causing desense of the RX path 404-2. To address this, in some aspects, the transceiver front end may configure the RX path 404-1 to operate in the high linearity mode in order to mitigate desensing of the B2 Rx band 620 in the RX path 404-2. For example, in the high linearity mode, the attenuator 410-1 may attenuate the signal in the B66 Rx band 626 and the transmit signals 622, 624 by x dB (e.g., where 0<x≤15). Note, the transmit signals 642, 644 in stage 694 may be amplified versions of the transmit signals 632, 634, respectively, in stage 692. Similarly, the transmit signals 632, 634 in stage 692 may be attenuated versions of the transmit signals 622, 624, respectively, in stage 690.

Figure 7:
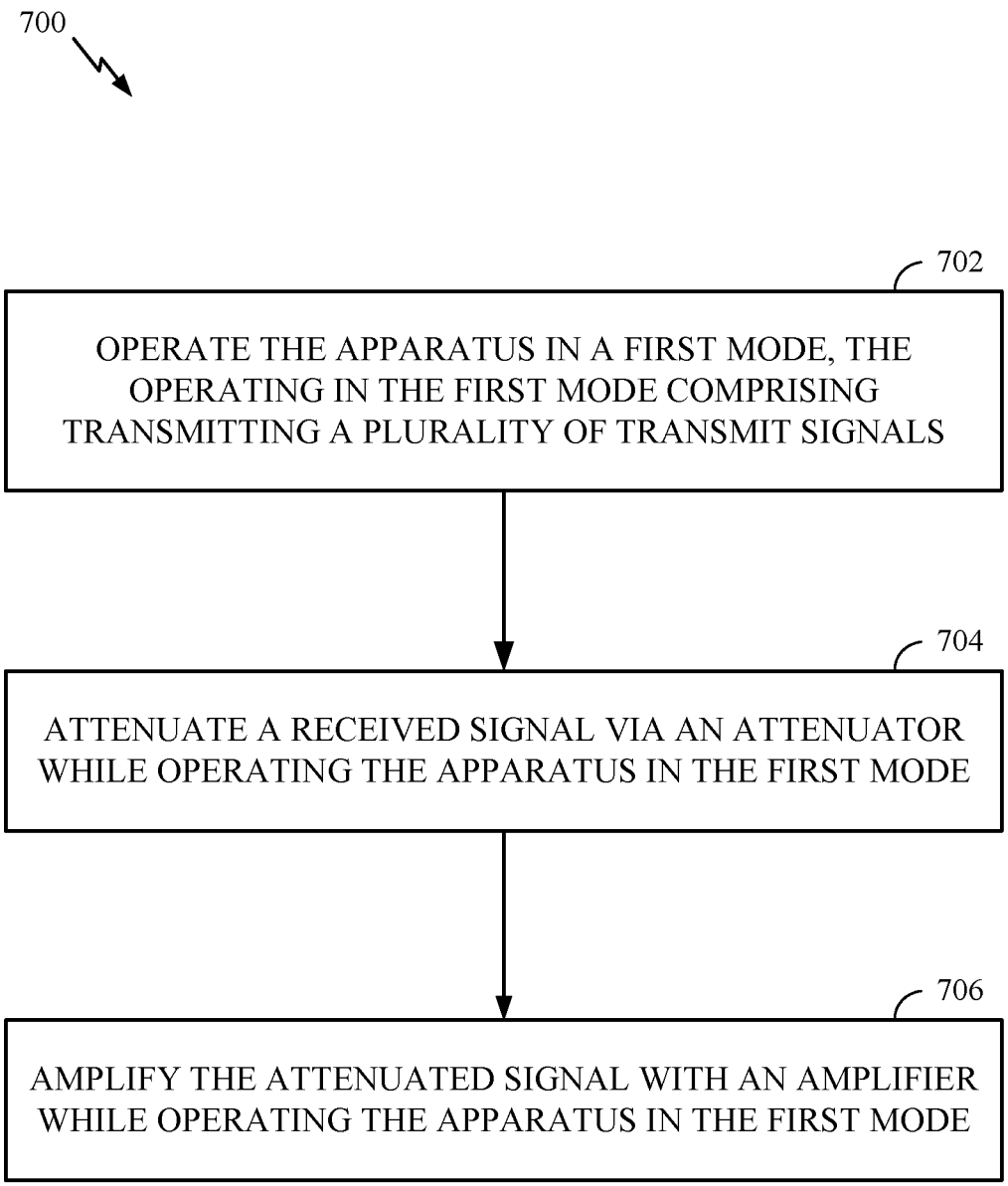
FIG. 7 is a flow diagram of example operations for wireless communications, in accordance with certain aspects of the present disclosure.

FIG. 7 is a flow diagram of example operations 700 for wireless communications, in accordance with certain aspects of the present disclosure. The operations 700 may be performed by an apparatus (e.g., transceiver front end 254, transceiver front end 300, etc.).

The operations 700 may begin, at block 702, where the apparatus operates in a first mode. Operating in the first mode may include (concurrently) transmitting a plurality of transmit signals (e.g., signals 522, 524). In one aspect, the first mode includes a CA mode, such as ULCA. In another aspect, the first mode includes a DC mode, such as EN-DC.

At block 704, the apparatus attenuates a received signal (e.g., signal in the B2 Rx band 420) via an attenuator (e.g., attenuator 410) while operating the apparatus in the first mode (e.g., while concurrently transmitting the plurality of transmit signals as part of a CA mode or DC mode). In some aspects, the operations 700 may further include tuning the attenuator. For example, the attenuator may be tunable between 0 and 15 dB. The attenuating may include opening a series switch (e.g., bypass switch 450) coupled in parallel with the attenuator. At block 706, the apparatus amplifies the attenuated signal (e.g., signal in B2 Rx band 520) with an amplifier (e.g., LNA 322) while operating the apparatus in the first mode (e.g., while concurrently transmitting the plurality of transmit signals).

In some aspects, operating the apparatus in the first mode (at blocks 702, 704, and 706) may introduce a jammer signal (e.g., jammer signal 526) in a receive band (e.g., B2 Rx band 530) for the received signal (e.g., signal in B2 Rx band 530). The jammer signal may be a third-order intermodulation product from two of the plurality of transmit signals (e.g., signals 522, 524).

In some aspects, the operations 700 may further include: operating the apparatus in a second mode, different from the first mode; bypassing the attenuator while operating the apparatus in the second mode; and amplifying the received signal with the amplifier while operating the apparatus in the second mode. In some cases, bypassing the attenuator may include closing a series switch (e.g., bypass switch 450) coupled in parallel with the attenuator. In one aspect, operating the apparatus in the second mode may include transmitting one or more transmit signals. In one aspect, operating the apparatus in the second mode may not introduce a jammer signal having a frequency in a receive band (e.g., B2 Rx band) for the received signal.

In aspects where the apparatus operates in the second mode, the operations 700 may further include: mixing the amplified signal from the amplifier with a LO signal (e.g., from LO 416); and filtering the mixed signal using a baseband filter (e.g., BBF 326). The baseband filter may have a first gain while operating the apparatus in the first mode and may have a second gain while operating the apparatus in the second mode. The first gain may be greater than the second gain.

Based upon monitoring of a plurality of transmit signals (e.g., in CA or DC), certain aspects of the present disclosure are directed to controlling a bypass switch to couple a front-end attenuator to attenuate one or more jammers before such jammers reach the LNA. In this manner, the IMD component may be reduced, which may be at the cost of noise figure degradation.

Example Aspects

In addition to the various aspects described above, specific combinations of aspects are within the scope of the disclosure, some of which are detailed below:

Aspect 1: A method of wireless communication by an apparatus, comprising: operating the apparatus in a first mode, the operating in the first mode comprising transmitting a plurality of transmit signals; attenuating a received signal via an attenuator while operating the apparatus in the first mode; and amplifying the attenuated signal with an amplifier while operating the apparatus in the first mode.

Aspect 2: The method according to Aspect 1, wherein operating the apparatus in the first mode introduces a jammer signal having a frequency in a receive band for the received signal.

Aspect 3: The method according to Aspect 2, wherein the jammer signal is a third-order intermodulation product from two of the plurality of transmit signals.

Aspect 4: The method according to any of Aspects 1-3, wherein the first mode comprises uplink carrier aggregation (ULCA).

Aspect 5: The method according to any of Aspects 1-3, wherein the first mode comprises E-UTRAN New Radio Dual Connectivity (EN-DC).

Aspect 6: The method according to any of Aspects 1-5, further comprising: operating the apparatus in a second mode, different from the first mode; bypassing the attenuator while operating the apparatus in the second mode; and amplifying the received signal with the amplifier while operating the apparatus in the second mode.

Aspect 7: The method according to Aspect 6, wherein operating the apparatus in the second mode comprises transmitting one or more transmit signals.

Aspect 8: The method according to any of Aspects 6-7, wherein operating the apparatus in the second mode does not introduce a jammer signal having a frequency in a receive band for the received signal.

Aspect 9: The method according to any of Aspects 6-8, further comprising: mixing the amplified signal from the amplifier with a local oscillator signal; and filtering the mixed signal using a baseband filter, wherein: the baseband filter has a first gain while operating the apparatus in the first mode; the baseband filter has a second gain while operating the apparatus in the second mode; and the first gain is greater than the second gain.

Aspect 10: The method according to any of Aspects 6-9, wherein: the bypassing comprises closing a series switch coupled in parallel with the attenuator; and the attenuating comprises opening the series switch.

Aspect 11: The method according to any of Aspects 1-10, further comprising tuning the attenuator, wherein the attenuator is tunable between 0 and 15 dB.

Aspect 12: A wireless device comprising: one or more transmitters configured to transmit a plurality of transmit signals; a receiver comprising an attenuator and an amplifier having an input coupled to an output of the attenuator; at least one processor coupled to the receiver; and a memory coupled to the at least one processor and storing computer-executable instructions, which, when executed by the at least one processor, perform an operation comprising: operating the one or more transmitters and the receiver in a first mode, the operating comprising transmitting the plurality of transmit signals using the one or more transmitters; attenuating a received signal via the attenuator while operating in the first mode; and amplifying the attenuated signal with the amplifier while operating in the first mode.

Aspect 13: The wireless device according to Aspect 12, wherein operating in the first mode introduces a jammer signal having a frequency in a receive band for the received signal.

Aspect 14: The wireless device according to Aspect 13, wherein the jammer signal is a third-order intermodulation product from two of the plurality of transmit signals.

Aspect 15: The wireless device according to any of Aspects 12-14, wherein the first mode comprises uplink carrier aggregation (ULCA).

Aspect 16: The wireless device according to any of Aspects 12-14, wherein the first mode comprises E-UTRAN New Radio Dual Connectivity (EN-DC).

Aspect 17: The wireless device according to any of Aspects 12-16, the operation further comprising: operating the one or more transmitters and the receiver in a second mode, different from the first mode; bypassing the attenuator while operating in the second mode; and amplifying the received signal with the amplifier while operating in the second mode.

Aspect 18: The wireless device according to Aspect 17, wherein: the receiver further comprises a switch having a first terminal coupled to an input of the attenuator and having a second terminal coupled to the output of the attenuator; the bypassing comprises closing the switch; and the attenuating comprises opening the switch.

Aspect 19: The wireless device according to any of Aspects 17-18, wherein operating in the second mode comprises transmitting one or more transmit signals.

Aspect 20: The wireless device according to any of Aspects 17-19, wherein operating in the second mode does not introduce a jammer signal having a frequency in a receive band for the received signal.

Aspect 21: The wireless device according to any of Aspects 17-20, wherein: the receiver further comprises: a mixer having a first input coupled to an output of the amplifier; a local oscillator having an output coupled to a second input of the mixer; and a baseband filter having an input coupled to an output of the mixer; the operation further comprises: mixing the amplified signal from the amplifier with a local oscillator signal from the local oscillator; and filtering the mixed signal using the baseband filter; the baseband filter has a first gain while operating in the first mode; the baseband filter has a second gain while operating in the second mode; and the first gain is greater than the second gain.

Aspect 22: The wireless device according to any of Aspects 12-21, the operation further comprising tuning the attenuator, wherein the attenuator is tunable between 0 and 15 dB.

Aspect 23: An apparatus comprising: means for concurrently transmitting a plurality of transmit signals; means for controlling operation of the apparatus in a first mode, wherein operation in the first mode comprises concurrently transmitting the plurality of transmit signals using the means for concurrently transmitting; means for attenuating a received signal during operation of the apparatus in the first mode; and means for amplifying the attenuated signal during operation of the apparatus in the first mode.

Aspect 24: The apparatus according to Aspect 23, further comprising: means for controlling operation of the apparatus in a second mode, different from the first mode; and means for bypassing the means for attenuating during operation of the apparatus in the second mode, wherein the means for amplifying is configured to amplify the received signal during operation of the apparatus in the second mode.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. For example, means for concurrently transmitting a plurality of transmit signals may include, for example, a transmitter (e.g., transceiver front end 254), an antenna(s) (e.g., antennas 252), etc. Means for controlling operation of the apparatus may include, for example, one or more processors (e.g., controller 280, TX data processor 288, etc.). Means for attenuating may include, for example, an attenuator (e.g., attenuator 410). Means for amplifying may include, for example, an amplifier (e.g., LNA 322). Means for bypassing may include, for example, a switch (e.g., bypass switch 450). Means for mixing may include, for example, a mixer (e.g., mixer 324). Means for filtering may include, for example, a baseband filter (e.g., BBF 326).

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A method of wireless communication by an apparatus, comprising:
   operating the apparatus in a first mode, the operating in the first mode comprising transmitting a plurality of transmit signals;
   attenuating a received signal via an attenuator while operating the apparatus in the first mode;
   amplifying the attenuated signal with an amplifier while operating the apparatus in the first model;
   operating the apparatus in a second mode, different from the first mode;
   bypassing the attenuator while operating the apparatus in the second mode;
   amplifying the received signal with the amplifier while operating the apparatus in the second mode;
   mixing the amplified signal from the amplifier with a local oscillator signal; and
   filtering the mixed signal using a baseband filter, wherein:
   the baseband filter has a first gain while operating the apparatus in the first mode;
   the baseband filter has a second gain while operating the apparatus in the second mode; and
   the first gain is greater than the second gain.

2. The method of claim 1, wherein operating the apparatus in the first mode introduces a jammer signal having a frequency in a receive band for the received signal.

3. The method of claim 2, wherein the jammer signal is a third-order intermodulation product from two of the plurality of transmit signals.

4. The method of claim 1, wherein the first mode comprises uplink carrier aggregation (ULCA).

5. The method of claim 1, wherein the first mode comprises E-UTRAN New Radio Dual Connectivity (EN-DC).

6. The method of claim 1, wherein operating the apparatus in the second mode comprises transmitting one or more transmit signals.

7. The method of claim 1, wherein operating the apparatus in the second mode does not introduce a jammer signal having a frequency in a receive band for the received signal.

8. The method of claim 1, wherein:
   the bypassing comprises closing a series switch coupled in parallel with the attenuator; and
   the attenuating comprises opening the series switch.

9. The method of claim 1, further comprising tuning the attenuator, wherein the attenuator is tunable between 0 and 15 dB.

10. A wireless device comprising:
    one or more transmitters configured to transmit a plurality of transmit signals;
    a receiver comprising an attenuator, an amplifier having an input coupled to an output of the attenuator, a mixer having a first input coupled to an output of the amplifier, a local oscillator having an output coupled to a second input of the mixer, and a baseband filter having an input coupled to an output of the mixer;
    at least one processor coupled to the receiver; and
    a memory coupled to the at least one processor and storing computer-executable instructions, which, when executed by the at least one processor, perform an operation comprising:
    operating the one or more transmitters and the receiver in a first mode, the operating comprising transmitting the plurality of transmit signals using the one or more transmitters;
    attenuating a received signal via the attenuator while operating in the first mode;
    amplifying the attenuated signal with the amplifier while operating in the first model;
    operating the one or more transmitters and the receiver in a second mode, different from the first mode;
    bypassing the attenuator while operating in the second mode;
    amplifying the received signal with the amplifier while operating in the second mode;
    mixing the amplified signal from the amplifier with a local oscillator signal from the local oscillator; and
    filtering the mixed signal using the baseband filter, wherein:
    the baseband filter has a first gain while operating in the first mode;
    the baseband filter has a second gain while operating in the second mode; and
    the first gain is greater than the second gain.

11. The wireless device of claim 10, wherein operating in the first mode introduces a jammer signal having a frequency in a receive band for the received signal.

12. The wireless device of claim 11, wherein the jammer signal is a third-order intermodulation product from two of the plurality of transmit signals.

13. The wireless device of claim 10, wherein the first mode comprises uplink carrier aggregation (ULCA).

14. The wireless device of claim 10, wherein the first mode comprises E-UTRAN New Radio Dual Connectivity (EN-DC).

15. The wireless device of claim 12, wherein:
the receiver further comprises a switch having a first terminal coupled to an input of the attenuator and having a second terminal coupled to the output of the attenuator;
the bypassing comprises closing the switch; and
the attenuating comprises opening the switch.

16. The wireless device of claim 12, wherein operating in the second mode comprises transmitting one or more transmit signals.

17. The wireless device of claim 12, wherein operating in the second mode does not introduce a jammer signal having a frequency in a receive band for the received signal.

18. The wireless device of claim 10, the operation further comprising tuning the attenuator, wherein the attenuator is tunable between 0 and 15 dB.

19. An apparatus comprising:
means for concurrently transmitting a plurality of transmit signals;
means for controlling operation of the apparatus in a first mode, wherein operation in the first mode comprises concurrently transmitting the plurality of transmit signals using the means for concurrently transmitting;
means for attenuating a received signal during operation of the apparatus in the first mode;
means for amplifying the attenuated signal during operation of the apparatus in the first mode;
means for controlling operation of the apparatus in a second mode, different from the first mode;
means for bypassing the means for attenuating during operation of the apparatus in the second mode, wherein the means for amplifying is configured to amplify the received signal during operation of the apparatus in the second mode;
means for mixing the amplified signal from the means for amplifying with a local oscillator signal; and
means for filtering the mixed signal, wherein:
the means for filtering has a first gain during operation of the apparatus in the first mode;
the means for filtering has a second gain during operation of the apparatus in the second mode; and
the first gain is greater than the second gain.

20. The apparatus of claim 19, wherein the operation of the apparatus in the first mode introduces a jammer signal having a frequency in a receive band for the received signal.

21. The apparatus of claim 20, wherein the jammer signal is a third-order intermodulation product from two of the plurality of transmit signals.

22. The apparatus of claim 19, wherein the first mode comprises uplink carrier aggregation (ULCA).

23. The apparatus of claim 19, wherein the first mode comprises E-UTRAN New Radio Dual Connectivity (EN-DC).

24. The apparatus of claim 19, wherein the operation of the apparatus in the second mode does not introduce a jammer signal having a frequency in a receive band for the received signal.

* * * * *